United States Patent [19]

Glendinning

[11] Patent Number: 4,816,361

[45] Date of Patent: Mar. 28, 1989

[54] PATTERNING OPTICAL AND X-RAY MASKS FOR INTEGRATED CIRCUIT FABRICATION

[75] Inventor: William B. Glendinning, Red Bank, N.J.

[73] Assignee: The United States of America as represented by the Secretary of the Army, Washington, D.C.

[21] Appl. No.: 125,860

[22] Filed: Nov. 27, 1987

[51] Int. Cl.$^4$ .............................................. G03F 1/00
[52] U.S. Cl. .......................................... 430/5; 430/30; 430/296; 430/323; 430/324; 430/394; 430/942; 430/945; 250/492.3; 378/35
[58] Field of Search ............... 430/296, 942, 314, 315, 430/312, 318, 967, 945, 5, 30, 323, 324, 329, 394; 250/492.2 B, 492.3; 378/35

[56] References Cited

U.S. PATENT DOCUMENTS

| | | | |
|---|---|---|---|
| 4,264,711 | 4/1981 | Greeneich | 430/296 |
| 4,610,948 | 9/1986 | Glendinning | 430/296 |
| 4,717,644 | 1/1988 | Jones et al. | 430/296 |

OTHER PUBLICATIONS

Seliger et al, "Ion Beams Promise Pratical Systems . . . ", Electronics, Mar. 27, 1980, pp. 142–146.
Potosky et al, "An Electron-Beam/Optical-Hybrid Lithography . . . ", J. Vac. Sci. Technol., 19(4), Nov./Dec. 1981, pp. 924–926.

Primary Examiner—José G. Dees
Attorney, Agent, or Firm—Sheldon Kanars; John K. Mullarney

[57] ABSTRACT

A layer of metal is deposited on a mask substrate and then covered with a layer of negative electron resist. A delineation of the peripheral boundaries of the desired mask geometry is carried out by means of a direct-write electron beam. After development and etching, the peripherally defined metal boundaries are all that remain on the substrate. The substrate is then covered with a positive electron resist. The mask is, next, raster scanned with a low intensity beam until a boundary is detected and then the beam intensity is increased significantly to a level sufficient to expose the positive resist. The scan and exposure continue until the mating peripheral boundary is detected and then the beam is rapidly decreased in intensity to its former low detection level. The positive resist subjected to the exposure level beam intensity is removed and a layer of metal is evaporated over the entire mask substrate. A lift-off operation leaves only the metal boundaries and the metal fill-in areas inside of the boundaries.

9 Claims, 1 Drawing Sheet

PATTERNING OPTICAL AND X-RAY MASKS FOR INTEGRATED CIRCUIT FABRICATION

The invention described herein may be manufactured, used, and licensed by or for the Government for governmental purposes without the payment to me of any royalties thereon.

TECHNICAL FIELD

The present invention relates generally to the fabrication of integrated circuits and, more particularly, to a novel technique or method of lithographic patterning of IC (integrated circuit) chip process mask plates (optical) and membranes (X-ray).

BACKGROUND OF THE INVENTION

Integrated circuit elements and the metallic interconnecting conductors thereon can be patterned on a wafer entirely by means of direct writing electron beam lithography (EBL). However, this fabrication technique requires excessive beam writing time of complex and expensive EBL machines and the complex circuit and conductor patterns so lithographed with many different spacings and widths of lithographed features requires complex correction of the computer-stored pattern to correct for proximity effects. Proximity effects are the widening of the lithographed features caused by forward and backscattering of the electron beam as it penetrates the electron resist material which covers the wafer. The magnitude of the proximity effect and hence the correction factor required is a function, among other things, of the widths of the features being lithographed.

The use of photolithography to imprint patterns on a chip or wafer by means of a patterned mask has been extensively used in the past for the fabrication of VHSIC/VLSI circuits. In fact, for historic and practical reasons, such as noted above, the use of patterned masks for IC fabrication is far-and-away the most common technique used today in IC fabrication.

U.S. Pat. No. 4,610,948, issued Sept. 9, 1986 to the present inventor, disclosed a hybrid technique which overcame some of the noted disadvantages associated with the direct writing EBL technique, as well as those theretofore encountered using patterned masks. The method of the patent achieves high accuracy, high density lithographing of complex integrated circuits (VHSIC/VLSI) in a relatively economical and simple manner. Unfortunately, this hybrid technique, which relies on a combination of direct writing e-beam lithography (EBL) with the use of patterned masks, has "throughput" limitations. While this technique or process is more efficient (i.e., faster) than the direct writing EBL approach, its throughput is less than the straightforward use of patterned masks for IC fabrication.

SUMMARY OF THE INVENTION

It is the primary object of the present invention to increase the throughput in IC chip fabrication, while improving mask quality in the fabrication of optical mask plates and X-ray membranes.

The above and other objects are attained in accordance with the present invention wherein a suitable layer of metal (e.g., chromium) is deposited on an optical mask plate (glass) or membrane (X-ray) and then covered with a layer of negative electron resist. A peripheral delineation of the desired mask geometry is carried out by means of a direct-write spot electron beam (e-beam). After development of the resist and etching of the Cr, in accordance with known techniques, the peripherally defined pattern boundaries are all that remain on the mask plate. The mask plate, including the peripherally outlined (Cr) pattern, is then covered or coated with a positive electron resist. The mask plate is raster scanned with a low intensity e-beam, laser beam (if positive resist is light sensitive) or ion beam until a peripheral boundary is detected by a backscatter detector, for example. The beam intensity is then increased significantly to a level sufficient to expose the positive resist. The scan and exposure continue until the "mating" peripheral boundary is detected and then the beam is rapidly decreased in intensity to its former low detection level. The positive resist subjected to the high, exposure level, beam intensity is removed by a known development technique. Next, a layer of chromium, for example, is evaporated over the entire mask plate. Finally, "lift-off" leaves the evaporated chromium to "fill-in" areas inside of the peripheral mask geometries thereby providing a completed high precision, high quality, defect free mask plate. After lift-off, the peripherally delineated mask geometry(s) and the fill-in areas are all that remain on the mask plate.

The above-described technique or method is equally applicable to membranes (X-ray).

BRIEF DESCRIPTION OF THE DRAWINGS

The invention will be more fully appreciated from the following detailed description when the same is considered in connection with the accompanying drawings in which.

DETAILED DESCRIPTION

The technique or process of the present invention comprises five basic steps which are depicted in FIGS. 1-5 of the drawings. Before beginning the novel method of the invention, the mask substrate is covered with a suitable layer of metal, such as chromium (Cr), tungsten (W), gold (Au), etc., and this, in turn, is covered with a layer of negative electron resist. If optical lithography is eventually used in making the integrated circuit chip, then the mask substrate will consist of a glass plate; whereas, a membrane substrate is utilized for X-ray lithography. For purposes of explanation, it shall be assumed hereinafter that a layer of Cr approximately 1KÅ in thickness is deposited on a glass plate of about 2 millimeters thickness. It should be understood, however, that the present invention is in no way limited to these recited materials or specified thicknesses.

Figure 1:
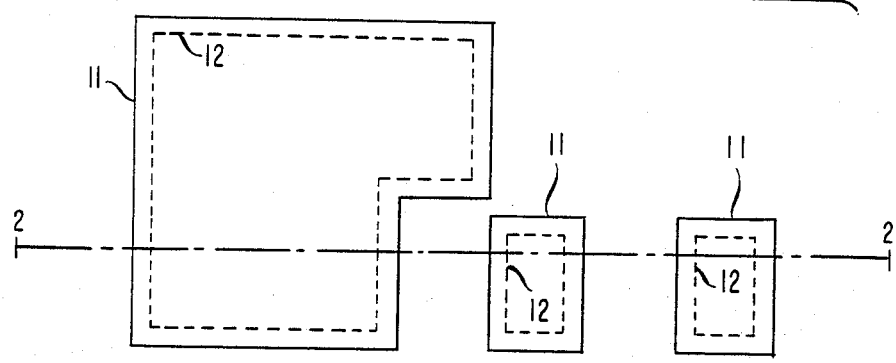
FIG. 1 shows an enlarged arbitrary mask pattern which may be utilized in the fabrication of a given level of an IC chip.

Turning now to FIG. 1 of the drawings, the lines 11 designate the outer peripheries of several parts or sections of an arbitrary mask pattern which may be utilized in the fabrication of a level of an integrated circuit wafer. As will be understood by those in the art, a plurality of mask patterns (e.g., five to seventeen or more) may be utilized in the fabrication of complex IC chips of submicron feature size. And, each of these mask patterns can be made in accordance with the five-step process of the invention.

A peripheral delineation of the desired mask geometry is carried out by means of a direct-write spot electron beam. That is, a spot e-beam is traced around the peripheral lines 11. This exposes the negative resist in the peripheral boundaries demarcated by the lines 11 and dotted lines 12. These exposed boundaries are on the order of 0.5 microns or less in width.

A development solution serves to remove the background negative resist and an etching operation serves to remove the background chromium. The exposed negative resist prevents removal of the peripheral Cr in this last etching step. Finally, another etching (e.g., an oxygen plasma dry etch) serves to remove the exposed negative resist that overlies the peripherally delineated Cr. These development and etching operations are carried out in accordance with well known techniques. After these development and etching steps, the peripherally defined Cr pattern boundaries are all that remain on the mask plate.

Figure 2:
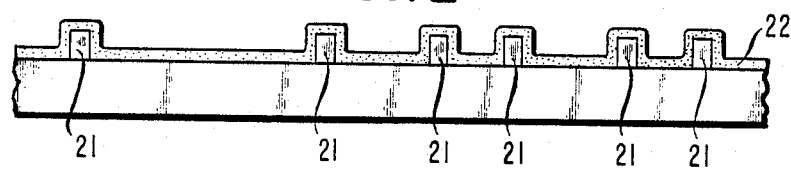
FIG. 2 is a side or elevation view of the mask pattern on the line 2—2 of FIG. 1, with a coating of positive electron resist thereon.

The glass plate as well as the peripheral Cr boundaries are now covered with a positive electron resist of approximately 5 KÅ in thickness. This step is depicted in FIG. 2 of the drawings wherein the chromium boundaries at the line 2—2 of FIG. 1 are shown as ridges 21 and the overlying positive resist is designated by reference numeral 22.

In accordance with the next step of the present invention, the resist covered mask plate is raster scanned with a low intensity e-beam (or laser beam if resist is light sensitive or ion beam) until a periphery boundary is detected by means of a backscatter detector, for example. The beam intensity is then increased significantly to a level sufficient to expose the positive resist. The line scan and exposure continue until the "mating" peripheral boundary is detected and then the beam is quickly decreased in intensity to its former low detection level. The positive resist subjected to the high, exposure level, beam intensity is then removed by a known development technique. The low detection level of the e-beam can be on the order of 0.5 nanoamperes, with a high exposure level intensity of 3-5 namps.

Figure 3:
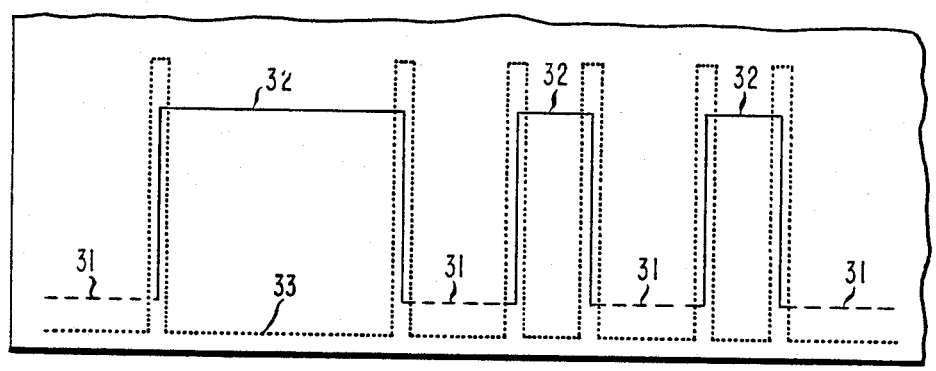
FIG. 3 illustrates e-beam intensity and the backscatter signal as the e-beam is swept over the mask pattern along the line 2—2 of FIG. 1.

The above-described scan operation is depicted in FIG. 3 of the drawings. An e-beam scan along the line 2—2 of FIG. 1 is figuratively illustrated. The dashed lines 31 indicate the low intensity levels of the e-beam during the 2—2 line scan; the solid lines 32 indicate the high, exposure level, intensity; and, the dotted line 33 indicates the backscatter signal out. Assuming a scan of the mask plate from left to right along line 2—2, the e-beam intensity is initially low as indicated by the leftmost dashed line 31. When the first peripheral Cr-covered boundary is detected the beam intensity is increased ten or more times, as indicated by the solid line 32 just to the right of the afore-mentioned dashed line 31. This high, exposure level, beam intensity continues until the mating peripheral boundary is detected and then the beam is rapidly decreased in intensity to its former low detection level 31. And, as successive boundaries are detected the beam intensity is successively increased and decreased in intensity.

As further indicated in FIG. 3, the backscatter signal 33 is quite low until a peripheral boundary or ridge is encountered in a left-to-right sweep of the e-beam. When the e-beam impinges on a boundary the backscatter signal increases dramatically as indicated by the dotted line 33 of FIG. 3. It is the detection of this increased backscatter signal that is utilized to increase the intensity of the e-beam. Thus, the backscatter detector can be considered as part of a positive feedback loop to the e-beam direct-write machine. Note, the relative amplitudes shown in FIG. 3 for the e-beam intensity and the backscatter signal are completely arbitrary.

As an alternative, the raster scan could be carried out using a continuous high intensity e-beam that is swept rapidly in the low detection mode and then slowed considerably for the exposure mode.

Figure 4:
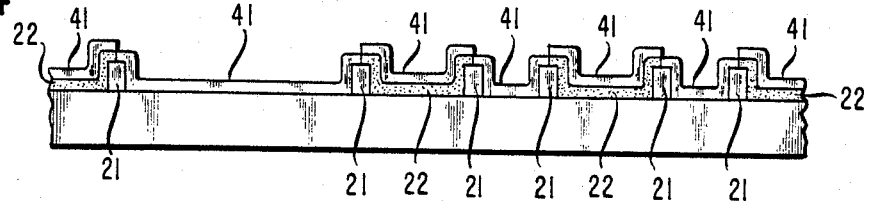
FIG. 4 is a side view of the mask pattern along the line 2—2 of FIG. 1 after a layer of chromium is evaporated over the mask plate.

After resist development, to remove the positive resist that is subjected to the high exposure level beam intensity, chromium is evaporated over the entire sample surface to a thickness of about 1 KÅ. Alternatively, electro-plating could be used to add metal. This step is depicted in FIG. 4 of the drawings. The Cr ridges 21 are the same as shown in FIG. 2 and the evaporated Cr is indicated by the reference numeral 41. It should be noted that the positive electron resist 22, deposited in step 2, will still cover the background areas (i.e., those areas lying outside the three patterns or parts circumscribed or encompassed by the ridges 21) as well as a portion of the ridges 21. The background areas remain covered by the positive resist because they have not been subjected to the high exposure level beam intensity. And, as will be better appreciated hereinafter, the partial covering of the ridges 21 is desirable since the outlines or peripheries of the three mask patterns are carried out by electron beam lithography (step 1) and thus a highly precise outline definition is achieved. This partial resist covering of the ridges 21 is due to delay, either inherent or introduced, in the feedback path from the backscatter detector to the e-beam direct-write machine. That is, the beam intensity cannot and/or should not be switch instantaneously when a ridge 21 is initially encountered.

Figure 5:
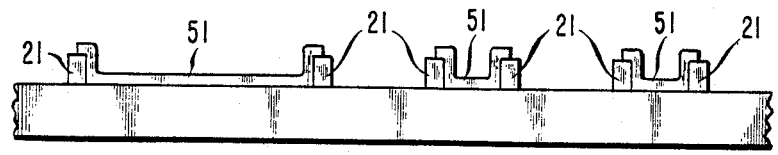
FIG. 5 is a side view of the resultant mask pattern after the "lift-off" of excess chromium.

The last step, "lift-off" leaves only the Cr ridges and the evaporated Cr in the "fill-in" areas inside the peripheral mask geometries thereby providing a completed high precision, high quality, defect free mask plate. As indicated in FIG. 5, after lift-off only the peripherally delineated mask geometries (i.e., ridges 21) and the Cr fill-in areas 51 remain on the mask plate. The lift-off of the positive electron resist 22 of FIG. 4 is accomplished by means of a conventional chemical solvent. And, when the positive resist is lifted off the overlying layer of Cr goes with it. The evaporated chromium 51 which partially covers the ridges 21 results in ridges with a double bump on top (see FIG. 5). This is of little consequence, however, since the plate of FIG. 5 is merely a patterned mask that is used to imprint patterns on a wafer by means of photolithography.

Instead of raster scanning an e-beam over the mask plate (step 3), a laser focused beam can be utilized in combination with a PMT (photomultiplier tube) detector. Further, instead of backscattering detection, a detector might be placed on the other side of the glass plate or membrane. The latter detector will measure the beam penetration through the mask plate or membrane and when a ridge is encountered the penetrating beam will drop in intensity and a feedback to the beam producing mechanism will serve to increase the impinging beam intensity.

Having thus shown and described what is at present considered to be the preferred technique for making very precise IC chip process masks, it should be understood that the same has been shown by way of illustration and not limitation. Accordingly, all modifications, alterations and changes coming within the spirit and scope of the invention as defined in the appended claims are herein meant to be included.

What is claimed is:

1. A method of lithographic patterning of integrated circuit chip process mask plates and mask membranes comprising the steps of:

applying a thin layer of metal over a mask substrate;

covering the layer of metal with a layer of negative electron resist;

delineating the peripheral boundaries of the desired mask geometry using a direct-write spot electron beam;

said electron beam serving to expose the resist in the peripheral boundaries delineated by said electron beam;

developing and etching the mask substrate to remove all but the peripheral metallic boundaries from the mask substrate;

coating the mask substrate and the metal boundaries thereon with a positive electron resist;

raster scanning the mask substrate with a low exposure level intensity beam until a peripheral boundary is detected, the detection then serving to increase the beam intensity ten or more times so as to expose the high intensity raster scanned positive resist;

said scanning and high intensity exposure continuing until the mating peripheral boundary is detected, the latter detection then serving to rapidly decrease the beam intensity to its former low exposure-level intensity;

developing the substrate to remove the positive electron resist subjected to the increased exposure-level beam intensity;

depositing a layer of metal over the entire mask substrate; and lifting-off the remaining positive electron resist and the metal covering the same so that only the peripheral metal boundaries and the metal layer between the boundaries remain on the mask substrate, said detection having an intrinsic delay so that the increase and decrease in beam intensity occurs a short predetermined time after a boundary has been encountered.

2. A method as defined in claim 1 wherein the peripheral boundaries delineated by the spot electron beam are on the order of 0.5 micron or less in width.

3. A method as defined in claim 2 wherein the deposited layer of metal partially covers the peripheral metal boundaries.

4. A method as defined in claim 3 wherein said mask substrate comprises a glass plate.

5. A method as defined in claim 3 wherein said mask substrate comprises a membrane suitable for X-ray lithography purposes.

6. A method as defined in claim 3 wherein the scanning beam is an electron beam.

7. A method as defined in claim 3 wherein the scanning beam is a laser beam.

8. A method as defined in claim 3 wherein the scanning beam is an ion beam.

9. A method as defined in claim 3 wherein the metal of the peripheral boundaries and the deposited layer of metal are both chromium.

* * * * *